United States Patent [19]

Aomura et al.

[11] 4,191,595

[45] Mar. 4, 1980

[54] METHOD OF MANUFACTURING PN JUNCTIONS IN A SEMICONDUCTOR REGION TO REACH AN ISOLATION LAYER WITHOUT EXPOSING THE SEMICONDUCTOR REGION SURFACE

[75] Inventors: Kunio Aomura; Fujiki Tokuyoshi; Masahiko Nakamae, all of Tokyo, Japan

[73] Assignee: Nippon Electric Co., Ltd., Tokyo, Japan

[21] Appl. No.: 835,328

[22] Filed: Sep. 21, 1977

[30] Foreign Application Priority Data

Sep. 22, 1976 [JP] Japan .................. 51/114052

[51] Int. Cl.$^2$ .................. H01L 29/72; H01L 21/225
[52] U.S. Cl. .................. 148/1.5; 357/20; 357/34; 357/50; 357/91
[58] Field of Search ............ 357/20, 50, 34, 91; 148/1.5

[56] References Cited

U.S. PATENT DOCUMENTS

| | | | |
|---|---|---|---|
| 3,798,081 | 3/1974 | Beyer | 148/188 |
| 3,904,450 | 9/1975 | Evans et al. | 148/175 |
| 3,933,540 | 1/1976 | Kondo et al. | 148/187 |
| 3,993,513 | 11/1976 | O'Brien | 148/175 |
| 3,996,077 | 12/1976 | Cornelis | 148/187 |
| 4,001,465 | 1/1977 | Graul et al. | 148/187 |
| 4,008,107 | 2/1977 | Hayasaka et al. | 148/175 |
| 4,044,454 | 8/1977 | Magdo | 29/578 |
| 4,066,473 | 1/1978 | O'Brien | 148/1.5 |

OTHER PUBLICATIONS

Evans et al., "Oxide Isolated Ion-Implanted Bipolar. . .", Digst. of Tech. Papers of 1973 IEEE Int. Solid State Circuits Conf., Philadelphia, Pa. USA, 14–16 Feb. 1973.
Jambotkar, "Recessed Oxide Isolated I.Cs.", IBM-TDB, 19 (1977) 4598.
Ko, "Recessed Oxide Isolation Method", IBM-TDB, 19 (1976), 1222.

Primary Examiner—L. Dewayne Rutledge
Assistant Examiner—Upendra Roy
Attorney, Agent, or Firm—Hopgood, Calimafde, Kalil, Blaustein & Lieberman

[57] ABSTRACT

In a semiconductor device including at least one active semiconductor region isolated by an oxide layer in a semiconductor substrate having a principal surface, at least two PN junctions, terminating at the oxide layer, are formed in the active region, by introduction of impurities into the active region with the active region surface never exposed during their formation. The junctions may partly reach the principal surface. The impurities may be introduced by ion implantation through a thin oxide film overlying the active region, and through use of other films placed on the oxide film, or by the known melt-through technique. At least one junction may be formed by epitaxial growth of a semiconductor layer of the opposite conductivity type.

6 Claims, 52 Drawing Figures

METHOD OF MANUFACTURING PN JUNCTIONS IN A SEMICONDUCTOR REGION TO REACH AN ISOLATION LAYER WITHOUT EXPOSING THE SEMICONDUCTOR REGION SURFACE

BACKGROUND OF THE INVENTION

This invention relates to a method of manufacturing a semiconductor device having such a structure that an oxide layer isolates a semiconductor element or part of an element from other elements or parts in a semiconductor substrate, and more particularly to a method of forming at least two PN junctions terminated at such an oxide layer.

In order to provide a compact assembly for a semiconductor device, it is often necessary to isolate a plurality of semiconductor elements and/or two or more active semiconductor regions of a semiconductor element by a relatively thick oxide layer. In such a semiconductor device assembly, it is readily feasible to form a single PN junction to be terminated at the oxide layer. It has, however, been difficult to form two or more PN junctions having their respective ends at the same side of the thick oxide layer. U.S. Pat. No. 3,996,077 discloses a prior art method of manufacturing the above-described semiconductor device. According to this prior art method, a plurality of junctions terminating at a thick oxide layer are formed by introducing impurities from an exposed semiconductor surface. The result is that the respective ends of the junctions, near the thick oxide layer, turn abruptly downward and desired termination thereof cannot be gained. This method will be described later in detail in conjunction with FIG. 1.

A Japanese Patent application, disclosed on Nov. 21, 1970 under Disclosure No. 50-145092 describes another prior art method in which a first PN junction defining a base-collector interface is formed by an ion implantation technique without exposing the surface of a collector region. With this method the deformation of the first junction near the thick oxide layer does not exist. However, a second PN junction, defining a base-emitter interface, is formed by diffusing an impurity from the exposed surface of the base region. Accordingly one end of the second junction, near the thick oxide layer turns abruptly downward and extends over the first junction. Therefore, desired termination of the junction cannot be achieved.

As is apparent from the prior art described above, it has been very difficult to control the distance between the PN junctions near their ends at the thick oxide layer. The difficulty of controlling this distance has resulted in a failure to achieve desired performance and even in contact between the PN junctions, thereby making it impossible to manufacture a semiconductor device.

It is therefore an object of the present invention to provide a reliable method of manufacturing a semiconductor device in which one end of two or more PN junctions is terminated at the same side of a relatively thick oxide layer selectively provided at a principal surface of the semiconductor body.

SUMMARY OF THE INVENTION

The method according to this invention, is based upon a new finding that the aforementioned impossibility of control of the PN junction interval results from the removal of the insulating film from the surface of the semiconductor region in which the PN junctions are to be formed. In the fabrication of a semiconductor device, with a thick oxide layer selectively formed at the surface, removal of an insulating film from the surface of the semiconductor region, adjoining the thick oxide layer, is inevitably associated with removal of the surface of the thick oxide layer because of alignment tolerance encountered with a mask removal process. Therefore, the surface portion of the thick oxide layer at the interface with the semiconductor region is removed and the shoulder portion as well as the surface of the semiconductor region are exposed. As a result, an impurity, when forming the PN junction, is introduced from the exposed shoulder portion, as well as from the exposed surface portion, into the semiconductor region, and the formed PN junction is bent down deeply, particularly at the one end portion terminated at the thick oxide layer. Thus, the interval between the end portions of two PN junctions becomes very small at the thick oxide layer.

According to the invention, at least two PN junctions, having end portions terminated at the same side of the thick oxide layer, are all formed without exposing the surface of the semiconductor region. As a result, the interval between the end portions of the PN junctions, at the thick oxide layer, can be controlled so that it is substantially the same as the interval between the main portions thereof. Formation of a PN junction, in the semiconductor region adjacent to the thick oxide layer, without exposing the surface of the semiconductor region, can be carried out, for example, by ion implantation into the semiconductor region through the insulation film covering the surface thereof or by the so-called "melt-through" technique in which an impurity is first doped into the oxide film covering the surface of the semiconductor region and then introduced into the region from the doped oxide film. At least one PN junction may be formed by epitaxial growth of a semiconductor layer of the opposite conductivity. This may be performed favorably through the process of epitaxially growing the semiconductor layer of opposite conductivity over a semiconductor substrate or layer of one conductivity and selectively oxidizing the epitaxial layer to a depth beyond the bottom of that epitaxial layer, thereby forming a PN junction terminated by the oxidized portion.

An example of a method, according to this invention, comprises the steps of preparing a structure of a semiconductor substrate of a first conductivity type with a relatively thin insulating film formed over the surface of the substrate and an isolation oxide layer sunken in predetermined portions of the substrate, an active region being defined in the substrate by the isolating oxide layer. Next an impurity of a second conductivity type opposite to the first conductivity type, is introduced into the active region by ion-implantation through the thin insulating film, thereby providing a first PN junction substantially parallel with the surface of the substrate and terminated at the side face of the isolation oxide layer. The first PN junction may be terminated partially at the surface of the active region. Next an impurity of the first conductivity type is selectively introduced into a portion of the active region, which active region portion includes a portion, adjoining the isolation oxide layer, the selective introduction being through the thin oxide film by an ion-implantation technique. The result is the formation of a second PN junction having a main portion parallel with the first PN junction, between the first PN junction and the surface of the active region and terminated partially at the isolation oxide layer and partially at the surface of the active region. A third PN junction may be similarly formed. The PN junctions, preferably the uppermost PN junction, may be formed by the melt-through technique. The lower PN junctions or lower-most PN junction may be formed by epitaxial growth as mentioned above.

The isolation may be partial so that one of the active regions of the device may be isolated from the other by a portion of the oxide layer. The active region, as described herein, may be a semiconductor region that serves to provide an electric connection to a buried semiconductor zone of the device.

These and other objects and features of the invention will be more fully appreciated from the following description when taken in conjunction with the accompanying drawings.

DESCRIPTION OF THE PREFERRED EMBODIMENTS

Referring to FIG. 1, one of the aforementioned conventional methods of manufacturing a semiconductor device will be described to obtain a better understanding of the present invention.

Figure 1A:
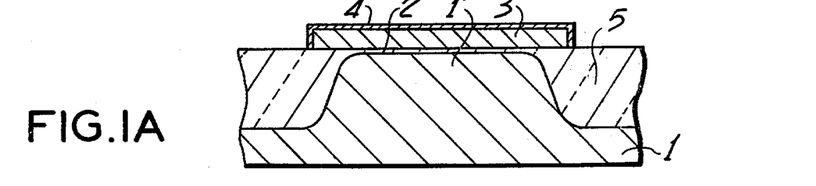
FIGS. 1A–1F are schematic exploded diagrams illustrating several sectional views of a semiconductor device being manufactured according to a conventional method.
Figure 1B:
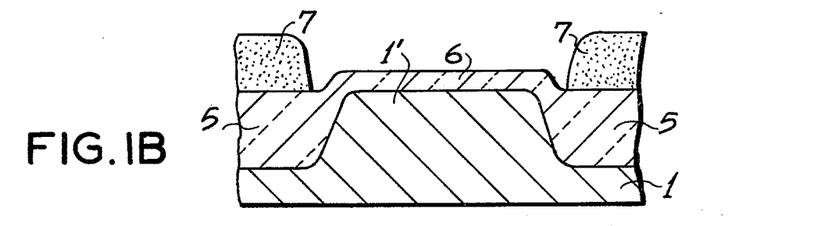
Figure 1C:
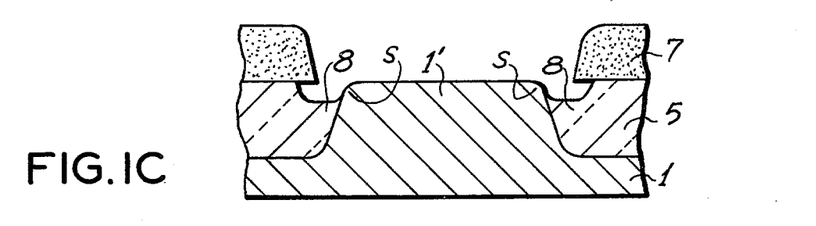

As shown in FIG. 1A, a thin oxide film 2 of a thickness of about 500 to 1000Å is formed by oxidizing the whole principal surface of a semiconductor substrate or a semiconductor layer 1. Subsequently, a silicon nitride ($Si_3N_4$) film 3 is formed on the whole oxide film 2 to a thickness of about 1000 to 2000Å and subjected to selective etching by the use of a silicon oxide film 4 formed thereon as a mask and using hot phosphoric acid as an etchant. The remaining silicon nitride film 3 is used as a mask for thermal oxidation so that a relatively thick isolating oxide layer 5 is formed to a thickness of about 1 to 2 microns by heating the substrate 1 at a relatively low temperature for a long duration of time to thereby leave one or more semiconductor island regions 1'. For simplicity of description, that portion of the thin oxide film 2, which is on the isolating oxide layer 5, will be considered to be a portion of the latter layer 5 while other portions of the film 2 will merely be referred to as the film 2 per se. In order to keep the principal surface flat, it is normal to preliminarily remove, to a predetermined depth, that portion of the substrate 1 at which the isolating oxide layer 5 is to be formed. As shown in FIG. 1B, the nitride film 3 and the oxide film 4 are removed. Subsequently, a relatively thick silicon oxide film 6 is formed on the exposed surface of the active region 1' to a thickness of about 3000 to 4000Å, followed by formation of a first photoresist 7 on the isolating oxide layer 5 for forming the first PN junction. In FIG. 1C, the relatively thick silicon oxide film 6 is selectively etched away with the photoresist 7 used as a mask. It is to be pointed out here that the photoresist 7 partly leaves the isolating oxide layer 5 uncovered (FIG. 1B). This is for the purpose of leaving a sufficient allowance for alignment of the mask patterns and of making it possible to utilize the merits of self-alignment. In particular, this is for enabling the relatively thick silicon oxide film 6 to be thoroughly removed. It is therefore inevitable that the removal of the silicon oxide film 6 results in partial removal of the isolating oxide layer 5 to uncover a shoulder S of the active region 1'.

Figure 1D:
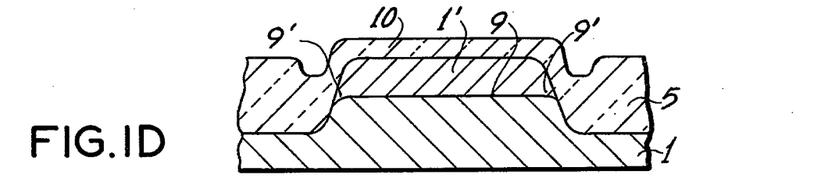
Figure 1E:
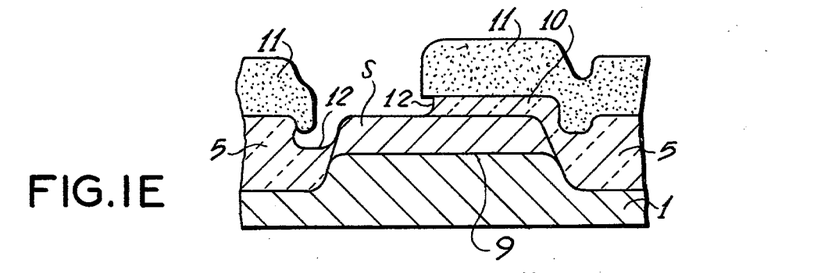
Figure 1F:
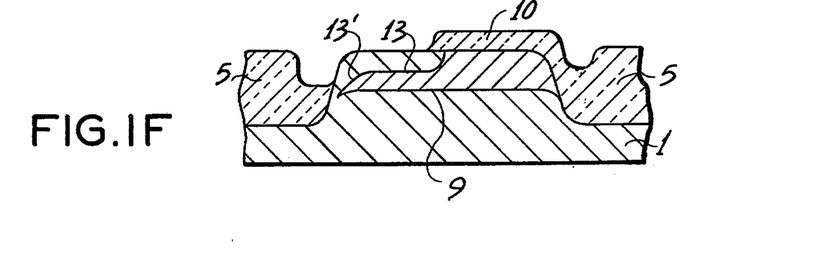
Figure 2A:
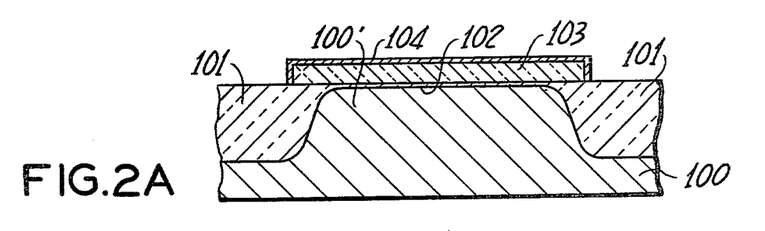
FIGS. 2A–2D are schematic exploded diagrams showing sectional views of a semiconductor device manufactured in compliance with a method acccording to a first embodiment of this invention.
Figure 2B:
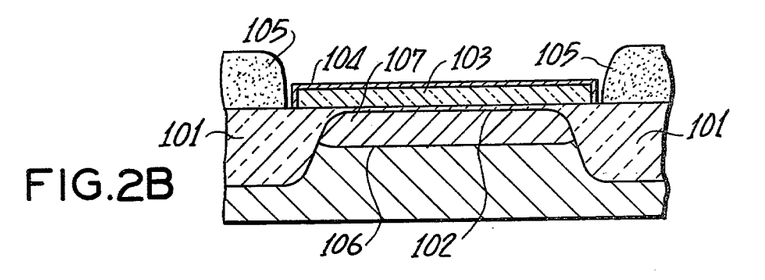
Figure 2C:
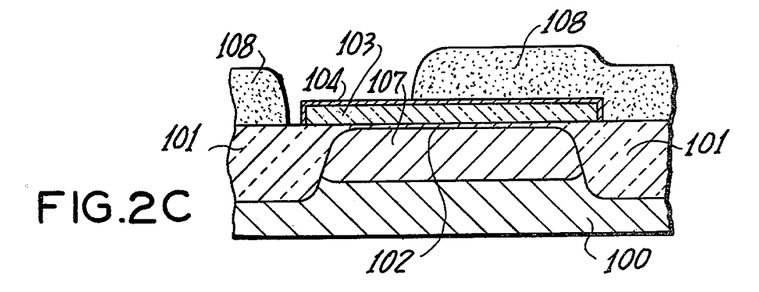
Figure 2D:
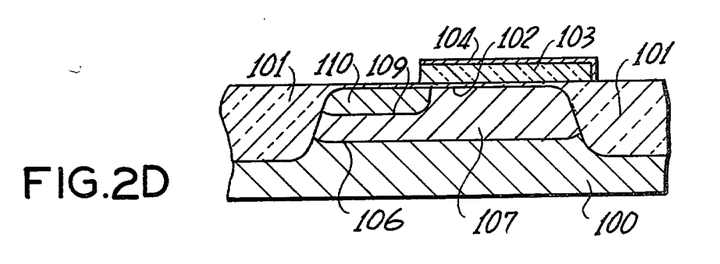

Further, as illustrated in FIG. 1D, the first PN junction 9 is formed by diffusion of an impurity therefor from the exposed surface of the active region 1'. Due to the presence of the exposed shoulder S, the PN junction 9 has a convex peripheral portion 9' at the interface with the thick oxide 5. This convex is inevitable because the oxide layer 6 is removed by resort to self-alignment between the thick oxide 5 and the island region 1'. After removal of the photoresist 7 the surface of the active region 1' is again covered with an oxide film 10 to a thickness of about 3000 to 4000Å. In FIG. 1E, a second photoresist 11 for forming the second PN junction 13 is formed on the isolating oxide layer 5 and extended onto a portion of the covering oxide film 10. The uncovered portion of the covering oxide film 10 is removed. The opening of the second photoresist 11, for the purpose of obtaining a sufficient exposure of isolating oxide layer 5, is again placed to allow for alignment. Etching away of the exposed oxide film 10 therefore results in removal of the isolating oxide layer 5 as indicated at 12, resulting in re-exposure of the shoulder S of the active region 1'. In this connection, it should be pointed out that the thickness of the isolating oxide layer 5 increased very little during formation of the covering oxide film 10 because the isolating oxide layer 5 is already considerably thick, while the shoulder S and the succeeding side face of the active region 1' has been covered with the oxide film 10 of almost the same thickness as that covering its top surface. Therefore, the oxide film is removed more deeply and the shoulder portion is exposed more widely than the first time (FIG. 1C). As shown in FIG. 1F, the second PN junction 13 is formed by diffusion of an impurity therefor through the exposed surface area of the active region 1'. The more exposed shoulder S makes the second PN junction 13 curve more sharply downward so as to result in a considerable convex end portion 13' at the interface with the oxide layer 5. This very often fails to reach the interface and intersects as exemplified in FIG. 1F with the first PN junction 9 so that an undesirable short occurs between the semiconductor zones to be partitioned by the junctions 9 and 13.

Even if the first PN junction is formed without exposing the shoulder S, as in the prior art, deformation of the second junction cannot be avoided. The convex at the edge portion of one or more PN junctions makes the interval between the PN junctions shorter, and desired characteristics of the device cannot be achieved.

The present invention solves the problems associated with formation of a structure in which a plurality of PN junctions are terminated at the same side wall of an isolating sunken oxide layer, while maintaining the advantage of self-alignment in formation of the PN junctions, by avoiding the excess removal of the sunken oxide layer, or more particularly, by keeping the surface of the island semiconductor region covered or unexposed during formation of the PN junctions.

Turning to FIGS. 2 through 9, a description will be given of the embodiments of this invention.

Referring to FIG. 2, a description will be given of a method according to a first embodiment of this invention. As shown in FIG. 2A, after a silicon oxide film 102 is formed to a thickness of 500–1000Å over a surface of an N-type silicon substrate (or N-type epitaxial layer) 100, a thick silicon oxide layer 101 is formed by the use of a silicon nitride film 103 of a thickness 0.1 to 0.2 microns as a mask for thermal oxidation. In this step, selective formation of the silicon nitride film 103 is preferably carried out by plasma etching with a silicon oxide film as a mask in an atmosphere of fluorochloroalkane generally known as Freon after deposition of a silicon nitride film. A first photoresist 105 is used as a mask, and the first PN junction 106, terminating at the isolating oxide film 101, is formed as depicted in FIG. 2B by ion implantation of a first impurity through the silicon oxide film 102, the silicon nitride film 103, and the silicon oxide film 104. This provides a P type region 107 defined by the PN junction 106. An example of the first impurity is boron. After the photoresist 105 is removed, a second photoresist 108, an aperture of which corresponds to a second junction to be formed, is selectively formed as shown in FIG. 2C. In FIG. 2D, those portions of the silicon nitride film 103 and the silicon oxide film 104, which are uncovered by the second photoresist 108, are removed. It is readily reasible, by utilizing the above-described plasma etching, to leave the thin silicon oxide film 104, which is uncovered by the second photoresist 108. It is also readily feasible by utilizing the above-described plasma etching, to leave the thin silicon oxide film 102 untouched because of the difference between rates of etching for the oxide film 102 and the nitride film 103. The second photoresist 108 is also removed. With the isolating silicon oxide layer 104 and the remaining portion of the silicon nitride film 103 used as a combined mask, the second PN junction 109, one end of which terminates at the surface of the isolating oxide layer 101, is formed by ion implantation of a second impurity, which may be arsenic, thereby providing an N type region defined by the second junction 109. Effective use is hereby made of self alignment.

It is apparent that the ion implantation technique enables the depth of junctions 106 and 109, and the impurity concentration in the semiconductor zones nearer to the principal surface, to be precisely controlled. Inasmuch as the surface of the active semiconductor region 1' is never exposed, it is possible to avoid exposure of the shoulder S depicted in FIG. 1 and the consequent deformation of the peripheral junction areas, such as those pointed out at 9 and 13 in FIG. 1. Therefore, the terminating portions of the two junctions 106 and 109, at the sunken oxide layer 101, maintain the same interval as at their main portions.

Figure 3A:
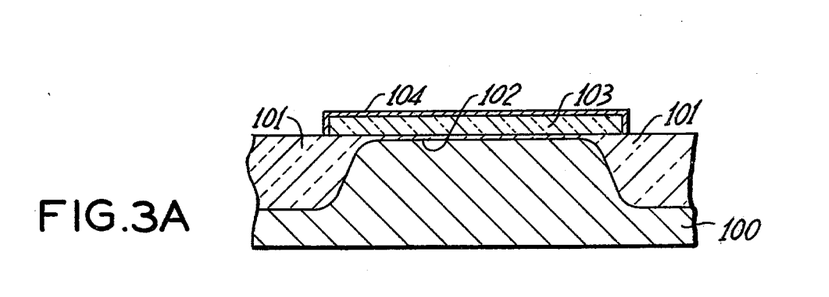
FIGS. 3A–3D are schematic exploded representations of sectional views of a semiconductor device being manufactured in compliance with a method according to a second embodiment of this invention.
Figure 3B:
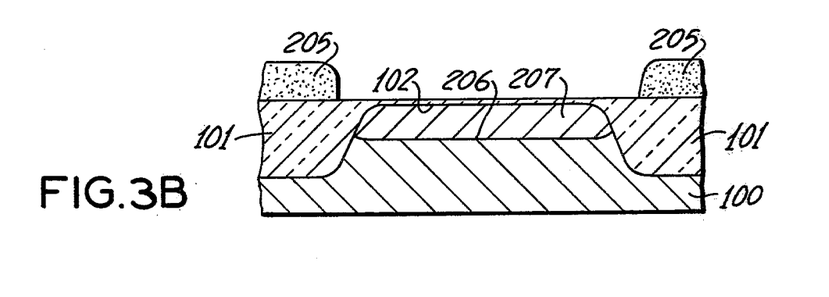
Figure 3C:
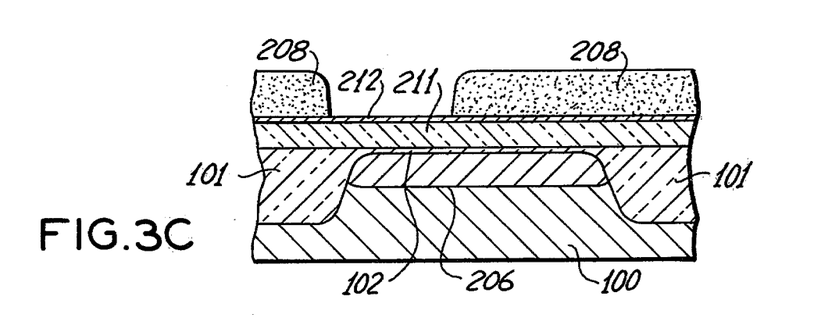
Figure 3D:
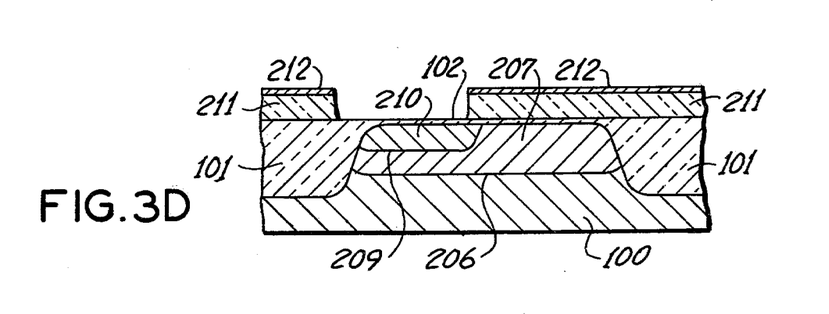

Referring to FIG. 3, a method according to a second embodiment of this invention is similar, insofar as the steps illustrated in FIG. 3A are concerned, to the corresponding steps of the method according to the first embodiment. In FIG. 3B, after the silicon nitride film 103 and the silicon oxide film 104 are removed, a first photoresist 205 is selectively formed. With the photoresist 205 used as a mask, the first PN junction 206, running between the isolating oxide films 101, is formed by ion implantation of boron through the thin silicon oxide film 102. After removal of the photoresist 205, as shown in FIG. 3C, the exposed surfaces of the isolating silicon oxide layer 101 and the thin oxide film 102 are covered with a second silicon nitride film 211, to a thickness of about 0.1 to 0.2 microns, and a second silicon oxide film 212. Next, a second photoresist 208 is selectively formed. In FIG. 3D, the second nitride film 211 and the second oxide film 212 are selectively etched away with the second photoresist 208 used as a mask. With the remaining portion of the second silicon nitride film 211 used as a mask, ion implantation of a second impurity, which may be arsenic, is carried out through the exposed portion of the thin silicon oxxide film 102 to form the second PN junction 209 which defines an N type region 210. Thus, the formation of the precisely controlled junctions 206 and 209 are achieved.

Next, with reference to FIGS. 4 through 6, embodiments of this invention in which, a bipolar transistor is manufactured, will be described.

Referring to FIG. 4, description will be made of a method according to a third embodiment of this invention. As depicted in FIG. 4A, the thin silicon oxide films 302 and 302', which are substantially the same, are formed over the surface of an N type silicon substrate 300. Also a continuous silicon nitride film is formed and selectively removed to leave the silicon nitride films 303 and 303' on the silicon oxide films 302 and 302', respectively. It is preferred to form the thin oxide films 302, 302' to a thickness of about 0.05 microns by thermal oxidation at about 700° C. and the silicon nitride films 303, 303' to a thickness of about 0.12 microns by thermal reaction of monosilane with ammonia at about 780° C. With the silicon nitride films 303, 303' used as a mask, the isolating silicon oxide layer 301, sunken downward into substrate 300, is formed by thermal oxidation of the substrate 11, thereby providing first active region 300' and second active region 300" isolated by the isolating silicon oxide layer 301'. In FIG. 4B, the nitride films 303, 303' are removed. The thin oxide films, 302 and 302' are turned into relatively thick silicon oxide films 320 and 320', of a thickness of about 0.3 microns, by again subjecting the substrate 300 to thermal oxidation. A first photoresist 305, of a thickness of about 0.5 microns or more, is selectively formed on the thickened silicon oxide films 320, 320' with an aperture left over the first active region 300'. With the isolating oxide layer 301 and the photoresist 305 used as a combined mask, a P type base region 307 is formed by ion implantation of first impurity ions, which may be boron, through the thickened oxide film 302. In this step, it is preferred to set the energy of implantation at about 100 keV and the dose at about $2 \times 10^{14}$ atoms per square centimeter.

Figure 4A:
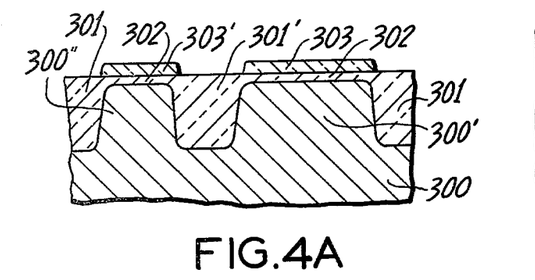
FIGS. 4A–4H are schematic exploded diagrams depicting sectional views of a semiconductor device being manufactured in compliance with a method according to a third embodiment of this invention.
Figure 4B:
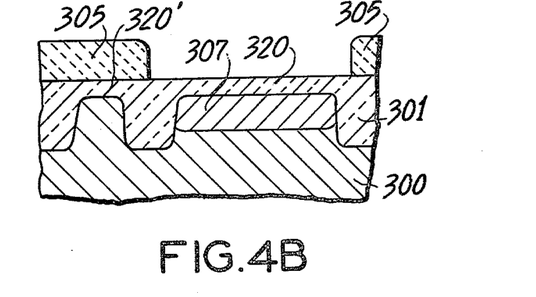
Figure 4C:
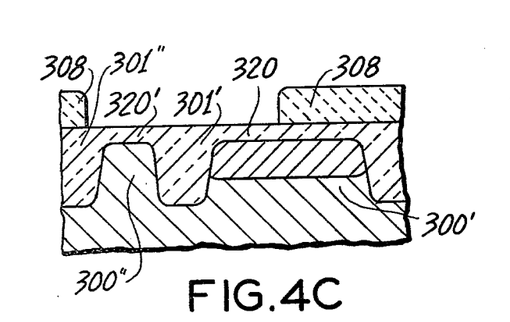
Figure 4D:
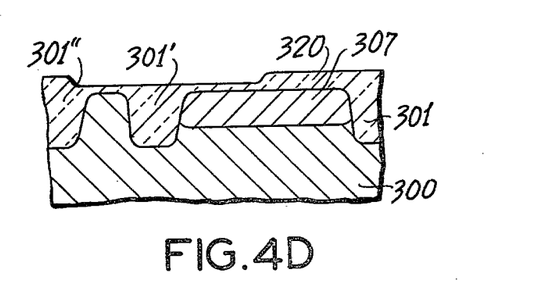
Figure 4E:
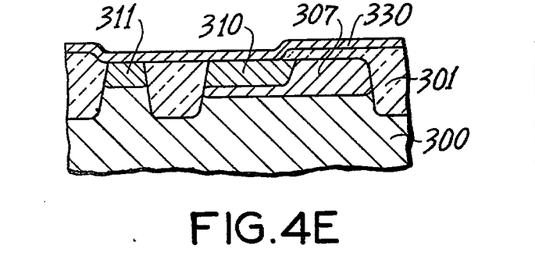
Figure 4F:
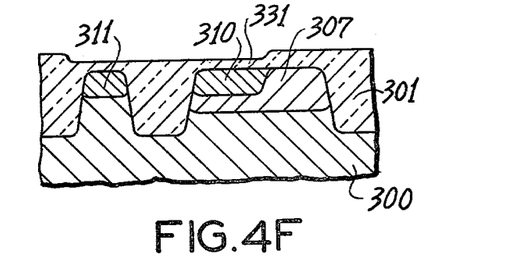
Figure 4G:
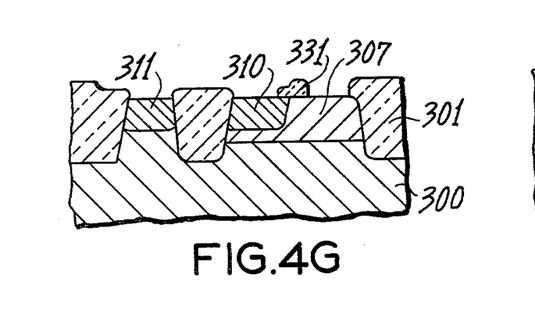
Figure 4H:
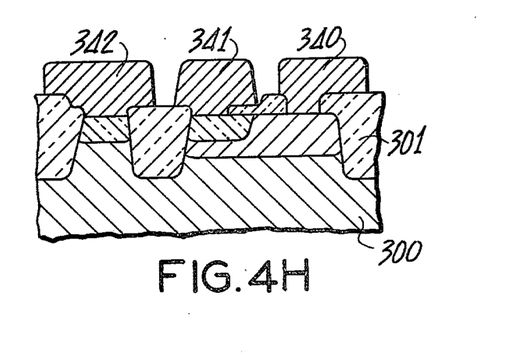
Figure 5A:
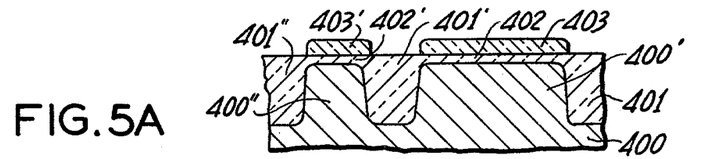
FIGS. 5A–5G are schematic exploded diagrams illustrating several sectional views of a bipolar transistor being manufactured in compliance with a method according to a fourth embodiment of this invention.
Figure 5B:
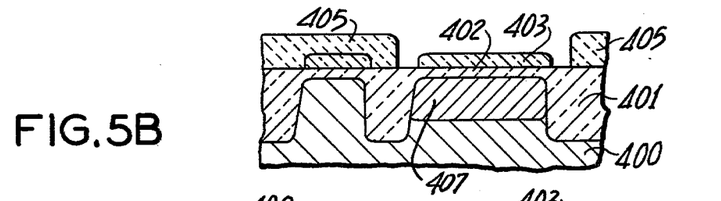
Figure 5C:
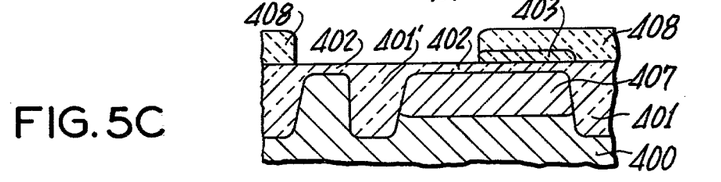
Figure 5D:
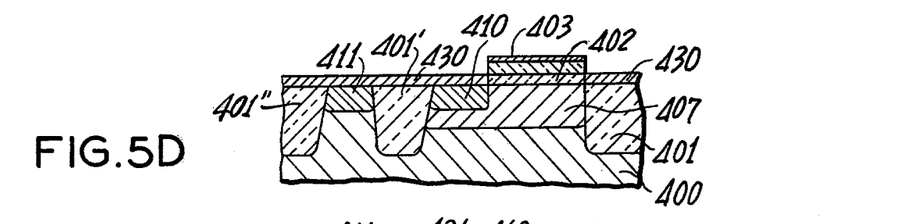
Figure 5E:
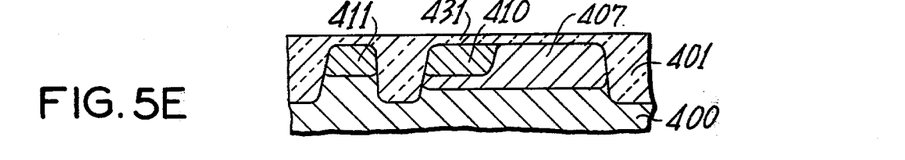
Figure 5F:
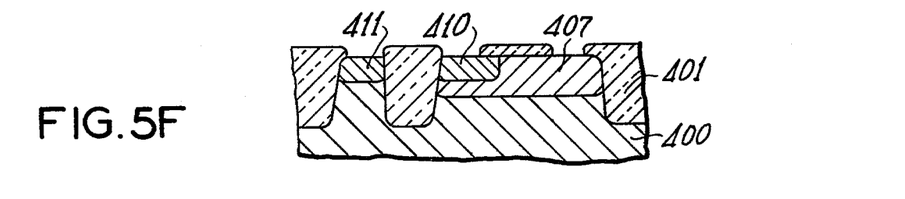
Figure 5G:
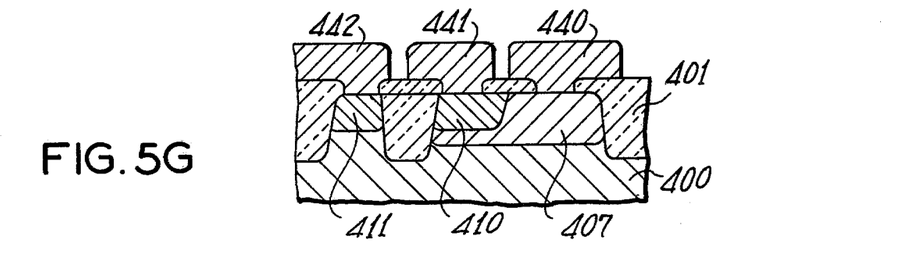

Further, as shown in FIG. 4C, after the photoresist 305 is removed, the substrate 300 is subjected to a high temperature and annealed. A second photoresist 308 is selectively formed to leave thickened oxide films 320 and 320', and the isolating oxide layer 301', 301" exposed selectively on that portion of the oxide layer 301' which isolates the first and second active regions 300' and 300", and above that portion of the first active region 300' which is nearer to the last-mentioned oxide layer portion 301'. In FIG. 4D, the thickened oxide films 320 and 320' are selectively shallowly etched to a thickness of about 0.5 microns with the second photoresist 37 used as a mask. After removal of the second photoresist 308, phosphorus is thermally diffused into the substrate 300. This turns the whole of the thinned portion of the oxide film 320, 320' and the whole surface of the remaining thickened oxide film 320 and 320' into a phosphorus-silicate glass film 330 as depicted in FIG. 4E. Film 330 (FIG. 4E) only partly sinks into the remaining portion of the thickened oxide film 320 and 320'. Continued heat treatment makes the phosphorus in the phosphorus-silicate glass film 330 diffuse further into the active regions 300' and 300" to form the emitter region 310 and the highly-doped collector contact region 311, respectively. It will not be understood that, the partition between the base region 307 and the emitter region 310, and the partition between the second active region 300" and the collector contact region 311, are formed by the so-called melt-through technique although they may also be formed by ion implantation. After removal of the phosphorus-silicate glass film 330, as depicted in FIG. 4F, a silicon oxide film 331 is newly formed to a thickness of about 0.2 microns by thermal oxidation. In FIG. 4G, apertures are formed through the oxide film 331 to expose at least portions of the base region 307, the emitter region 310, and the collector contact region 311. Next metal electrodes 340, 341 and 34D, which are electrically connected to the base region 307, to the emitter region 310 and to the collector contact region 311, respectively, are formed as shown in FIG. 4H by known photoetching.

Referring to FIG. 5, a method according to a fourth embodiment of this invention will be described. This embodiment comprises similar steps shown in FIG. 5A, as those illustrated with reference to FIG. 4A, except that the substrate is constructed of a P type semiconductor substrate (not shown) and an N type epitaxial layer 400 thereon. In FIG. 5B, a first photoresist 405 is selectively formed to expose the portion above the first active region 400' without removing the silicon nitride films 403, 403'. The base region 407 is therefore formed by carrying out the ion implantation of boron through the thin silicon oxide film 402 and the silicon nitride film 403 remaining above the first active semiconductor region 400'. After a second photoresist 408 is selectively formed as depicted in FIG. 5C, the nitride film 403' and the exposed portions of the nitride film 403 are removed. This is possible due to the difference between the rate of plasma etching for the nitride films 403, 403' and the second photoresist 408. In FIG. 5D, the second photoresist 408 is removed with the nitride film 403 remaining partially above the first active region 400'. Next, by the thermal diffusion of phosphorus, whole exposed portions of the thin oxide films 402, 402' are changed into the phosphorus-silicate glass film 430. In this step, the surface of the remaining nitride film 403 is slightly changed into the phosphorus-silicate glass film. The emitter region 410 and the collector contact region 411 are also formed by this thermal treatment. As shown in FIG. 5E, after the removal of the phosphorus-silicate glass film 430, a silicon oxide film 431 is newly formed and the remaining nitride film is etched away by the plasma etching. The following steps shown in FIGS. 5F and 5G are similar to those illustrated with reference to FIGS. 4G and 4H. Wherein, metal electrodes 440, 441 and 442 are finally formed in FIG. 5G.

The method according to this embodiment is preferred to that according to the third embodiment because it is unnecessary to include the somewhat technically troublesome step of partly removing the thickened oxide film 320 into the thinned portion as described in conjunction with FIG. 4D. In other respects, preferred conditions for the respective steps and dimensions of the parts for the method according to the fourth embodiment are similar to the equivalents for the method according to the third embodiment.

Referring to FIG. 6, a method according to a fifth embodiment of this invention will be described. This embodiment comprises similar steps shown in FIG. 6A, as those illustrated with reference to FIG. 4A, and the steps depicted in FIGS. 6B and 6C, which are similar to those described in conjunction with FIGS. 5B and 5C, except that the second photoresist 508 is extended from over the second active region 500" to partly over the first active region 500'. In FIG. 6D, the second photoresist 508 is removed to expose the covered portions of the silicon nitride films 503 and 503'. The substrate 500 of N type is subjected to the thermal oxidation with the remaining portions of the nitride films 503 and 503' used as a mask to partly thicken the thin silicon oxide film 502 to a slightly sunken silicon oxide film 520 of a total thickness of about 0.3 microns. As shown in FIGS. 6E and 6F, after the remaining nitride films 503 and 503' are removed, by the thermal diffusion of phosphorus, the whole remaining portion of the remaining thin oxide film 502 and the surface portion of the film 520 are changed into a phosphorus-silicate glass film 530. Also the emitter region 510 and the highly-doped collector contact region 511 are formed by thermal treatment as depicted in FIG. 6F. The subsequent steps shown in FIGS. 6G and 6H are similar to those illustrated with reference to FIGS. 4G and 4H.

Figure 6A:
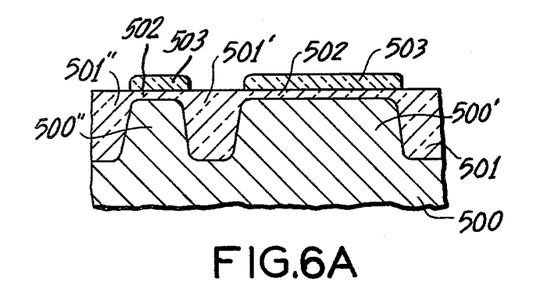
FIGS. 6A–6H are schematic exploded representations of several sectional views of a bipolar transistor being manufactured in compliance with a method according to a fifth embodiment of this invention.
Figure 6B:
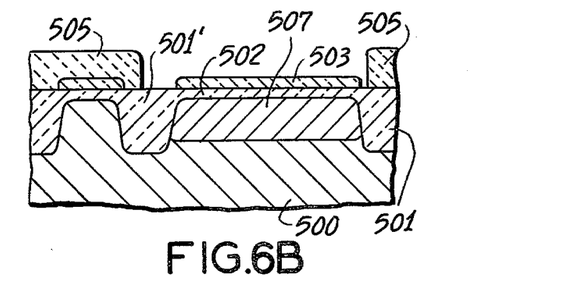
Figure 6C:
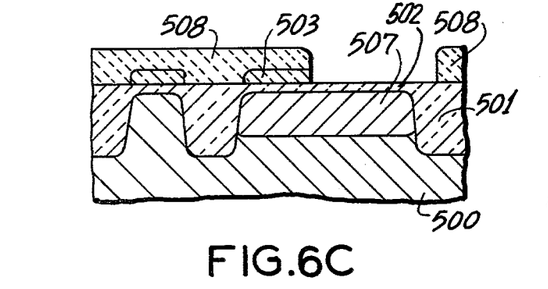
Figure 6D:
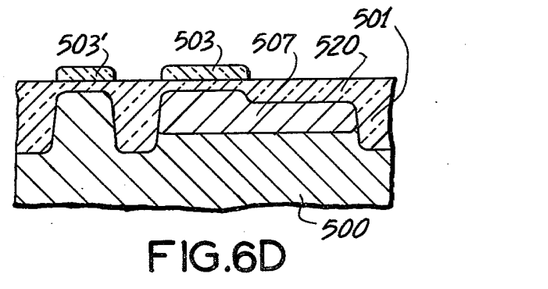
Figure 6E:
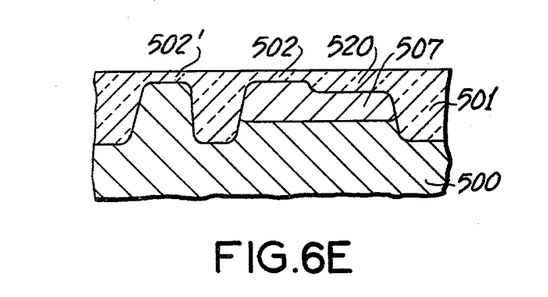
Figure 6F:
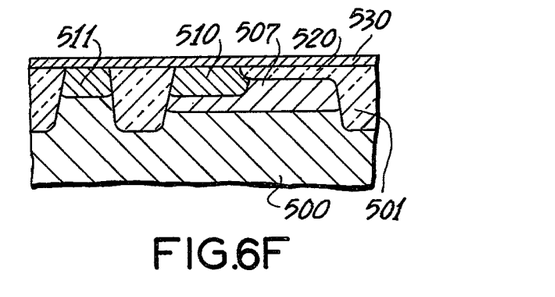
Figure 6G:
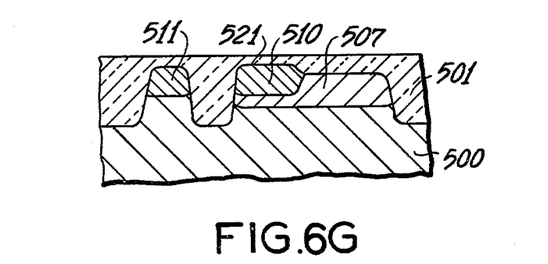
Figure 6H:
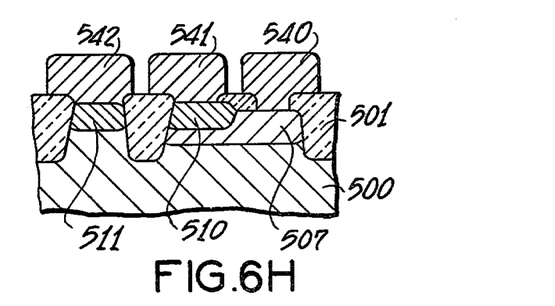
Figure 7A:
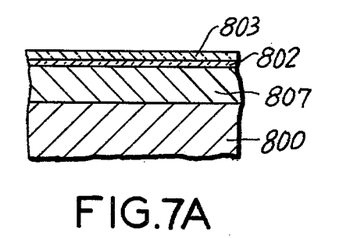
FIGS. 7A–7I are schematic exploded diagrams depicting several sectional views of a semiconductor device being manufactured in compliance with another method to which the method according to the third embodiment of this invention is applied.
Figure 7B:
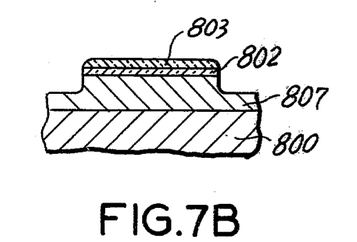
Figure 7C:
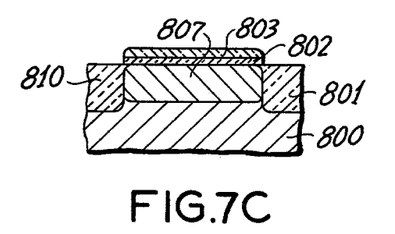
Figure 7D:
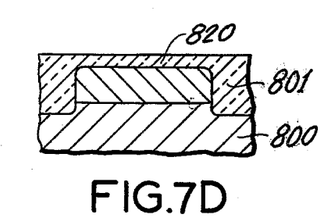
Figure 7E:
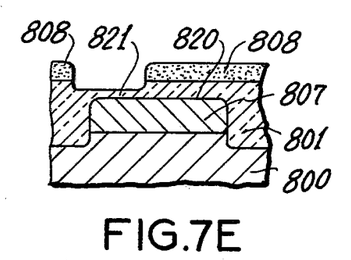
Figure 7F:
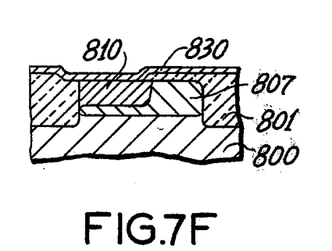
Figure 7G:
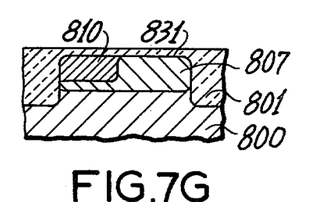
Figure 7H:
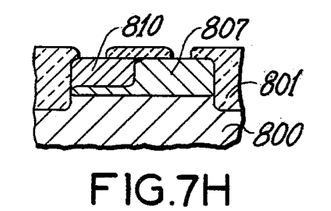
Figure 7I:
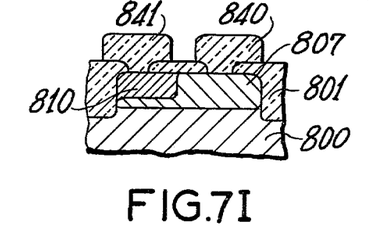

Thus the bipolar transistor, comprising the base electrode 540, the emitter electrode 541 and the collector electrode 542 is completed.

Referring now to FIG. 7, a semiconductor device is manufactured by another method to which the method according to the third embodiment of this invention is applied. In FIG. 7A, a P-type silicon layer 807 is epitaxially grown on ar N-type silicon substrate or layer 800. Then a thin silicon oxide film 802 and a silicon nitride film 803 are successively formed on the principal surface of the P-type silicon layer 807 to thicknesses of 0.05 and 0.15 microns, respectively. As depicted in FIG. 7B, the nitride film 803 and the oxide film 802 are successively selectively etched away. With the remaining oxide film 802 and the nitride film 803 used as a mask, the P-type silicon layer 807 is etched to a depth exceeding one half of the whole thickness thereof. With the nitride film 803 used as a mask, the P-type silicon layer 807 is selectively thermally oxidized into the isolating oxide layer 801, whose exposed surface is substantially flush with the interface between the P-type silicon layer 807 and the thin silicon oxide film 802, and which sinks into the N-type silicon substrate 800 as exemplified in FIG. 7C. This provides the PN junction between P-type silicon layer 807 and the substrate 800 which serves as the first PN junction in the active region. As depicted in FIG. 7D, after the nitride film 803 is removed, the remaining oxide film 802 is grown into a relatively thick silicon oxide film 820 of a thickness of about 0.3 microns. With the selectively formed photoresist 808 used as a mask as shown in FIG. 7E, the portion of the thickened silicon oxide film 820, which is located on the region to be doped with impurities, is shallowly etched to form a thinned oxide film 821 to a thickness of about 0.05 microns. In FIG. 7F, after the photoresist 808 is removed, phosphorus is thermally diffused to form a phosphorus-silicate glass film 830 as described in conjunction with FIG. 4E. Continued heat treatment causes the phosphorus to diffuse from the phosphorus-silicate glass film 830 into the contiguous portions of the P-type silicon layer 807 to form the N-type region 810 therein, thereby providing the second PN junction between the P-type silicon layer 807 and N-type region 810. In FIG. 7G, a new silicon oxide film 831 is substituted for the phosphate glass film 830. The remaining steps shown in FIGS. 7H and 7I are similar to those illustrated with reference to FIGS. 4G and 4H. Thus, the bipolar transistor comprising the base electrode 840, the emitter electrode 841 and the collector electrode (not shown) is completed.

Figure 8A:
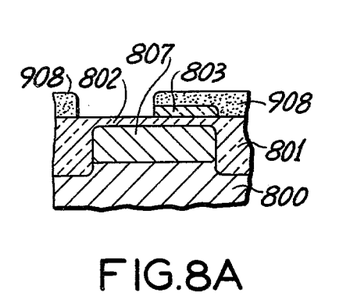
FIGS. 8A–8B are schematic exploded representations of sectional views of a semiconductor device being manufactured in compliance with still another method to which the method according to the fourth embodiment of this invention is applied.
Figure 8B:
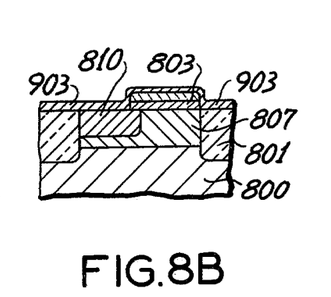

Referring to FIG. 8, a semiconductor device of the type illustrated with reference to FIG. 7 is manufactured by still another method. After a P-type silicon layer 807 is processed as described with reference to FIGS. 7A to 7C, the photoresist 908 is formed as shown in FIG. 8A and described in conjunction with FIG. 5C to cover the silicon nitride film 803, except for the portion overlying that portion of the base region in which the emitter region is to be formed. With the photoresist 908 used as a mask, the exposed portion of the nitride film 803 is etched away to expose the underlying area of the silicon oxide film 802 (about 0.05 microns thick). In FIG. 8B, the second PN junction, between the N-type region 810 and the P-type silicon layer 807, is formed by the melt-through technique as in the manner described in conjunction with FIG. 5D. Next the steps shown in FIGS. 7G to 7I are applied.

Figure 9A:
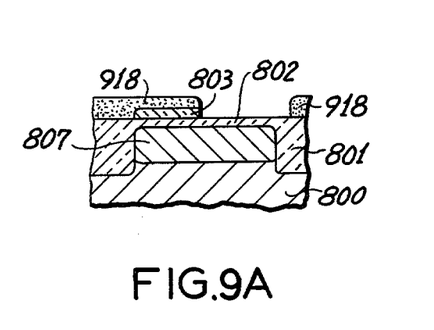
FIGS. 9A–9D are schematic exploded diagrams of sectional views of a semiconductor device being manufactured in compliance with yet another method to which the method according to the fifth embodiment of this invention is applied.
Figure 9B:
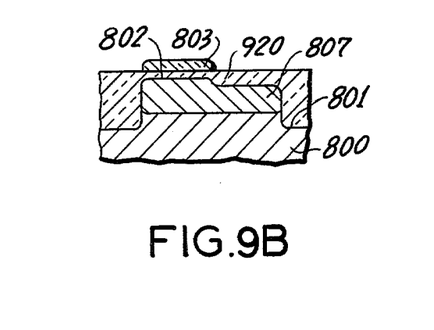
Figure 9C:
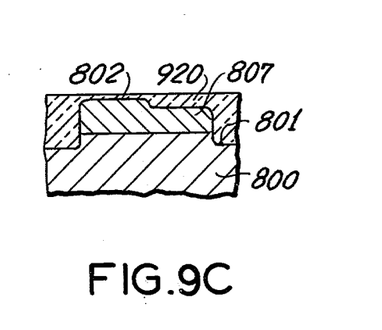
Figure 9D:
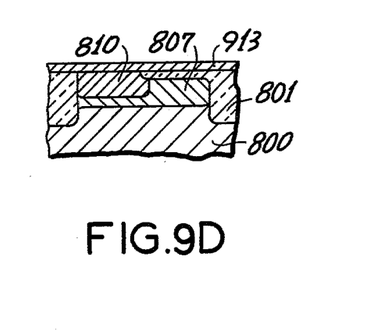

Finally referring to FIG. 9, a semiconductor device of the type illustrated with reference to FIG. 7 is manufactured by yet another method. After the P-type silicon layer 807 is subjected to the steps described with reference to FIGS. 7A–7C, the photoresist 918 is selectively formed as depicted in FIG. 9A, and described in conjunction with FIG. 6C, to cover the silicon nitride film 803 at its portion overlying that portion of the base region in which the emitter region is to be formed. The exposed portion of the nitride film 803 is etched away to expose the underlying area of the thin silicon oxide film 802 by the aforementioned plasma etching. After the photoresist 918 is removed, the substrate 800 is thermally oxidized to make the exposed portion of the thin oxide film 802 sink, as shown in FIG. 9B, to form a sunken silicon oxide film 920 of a total thickness of about 0.3 microns. Removal of the remaining portion of the nitride film 803 results in the substrate 800 depicted in FIG. 9C. As shown in FIG. 9D, the second PN junction between the N-type silicon layer 810 and the P-type silicon layer 807 is formed by the melt-through technique. Next the steps shown with conjunction to FIGS. 8H and 8I are applied. The melt-through method used to form a second PN junction in the embodiments of FIGS. 7 through 9 can be replaced by an ion-implantation technique. Transistors manufactured by the embodiments of FIGS. 4 through 9 are NPN type. PNP type transistors can be manufactured by reversing impurities or conductivity types.

While methods according to several preferred embodiments of this invention have thus far been described together with other methods to which this invention is applied, it is possible to implement these inventive concepts in other ways. For example, this invention is readily applicable to the manufacture of a high-speed transistor of the washed emitter structure, a diode, and an integrated circuit. The first PN junction 106, 206, or the like may not necessarily be parallel to the substrate principal surface. For the semiconductor devices illustrated with reference to FIGS. 2–6, it is possible to use isolation PN junctions. Ion implantation is applicable to formation of the isolation PN junctions and is feasible in place of the melt-through technique. The melt-through technique is also applicable in place of ion implantation. Incidentally, it is possible to regard the method according to the fourth embodiment described in conjunction with FIG. 5 to be a modification of the method according to the first embodiment as applied to a bipolar transistor and to combine the methods according to the first through fifth embodiments of this invention in various manners. Although not explicitly described hereinabove, the oxide or the silicon oxide film is an insulator film and should preferably have a uniform thickness particularly when the melt-through technique is used.

We claim:

1. A method of manufacturing a semiconductor device, comprising the steps of,
   preparing a semiconductor substrate of a first conductivity type,
   forming an oxide layer in said substrate, thereby forming a mesa semiconductor region in said substrate defined by said oxide layer,
   forming an insulator film of a uniform thickness on the upper surface of said mesa semiconductor region,
   carrying out ion implantation of impurities of a second conductivity type opposite to said first conductivity type, into said mesa semiconductor region through said insulator film thereon to form in said mesa semiconductor region a first PN junction, at least one end of which terminates at a first portion of a side face of said oxide layer,
   introducing impurities of said first conductivity type into an insulator film covering said upper surface to selectively convert a portion of said insulator film completely into a glass film including impurities of said first conductivity type and
   thermally diffusing impurities of said first conductivity type from said glass film into said mesa semiconductor region to form a second PN junction of a depth shallower than that of said first PN junction, at least one end of said second PN junction terminating at a second portion of said side face directly over said first portion.

2. A method of manufacturing a semiconductor device, comprising the steps of, preparing a semiconductor substrate of a first conductivity type, forming an insulator film of a uniform thickness on the upper surface of said semiconductor substrate, forming an oxide layer in said substrate thereby forming a mesa semiconductor region in said substrate defined by said oxide layer, carrying out ion implantation of impurities of a second conductivity type opposite to said first conductivity type, into said mesa semiconductor region through said insulator film thereon to form in said mesa semiconductor region a first PN junction, at least one end of which terminates at a first portion of a side face of said oxide layer, introducing impurities of said first conductivity type into said insulator film covering said upper surface to selectively convert a portion of said insulator film completely into a glass film including impurities of said first conductivity type, and thermally diffusing impurities of said first conductivity type from said glass film into said mesa semiconductor region to form a second PN junction of a depth shallower than that of said first PN junction, at least one end of said second PN junction terminating at a second portion of said side face directly over said first portion.

3. The method of claim 1 or 2, wherein said impurities introducing step includes the steps of selectively thinning a portion of an insulator film covering said upper surface and introducing impurities of said first conductivity type into said portion of said insulator film to convert said portion of said insulator film into a glass film including impurities of said first conductivity type.

4. The method of claim 1 or 2, wherein said impurities introducing step includes the steps of selectively thickening a portion of an insulator film covering said upper surface and introducing impurities of said first conductivity type into the remaining portion of said insulator film to convert said remaining portion of said insulator film into a glass film including impurities of said first conductivity type.

5. The method of claim 1 or 2, wherein said impurities introducing step includes the steps of forming a mask pattern on a portion of an insulator film covering said upper surface, and introducing impurities of said first conductivity type into the unmasked portion of said insulator film to convert said unmasked portion of said insulator film into a glass film including impurities of said first conductivity type.

6. The method according to claim 5, wherein said mask pattern comprises a silicon-nitride film.

* * * * *